US009257486B2

(12) United States Patent
Lin

(10) Patent No.: US 9,257,486 B2
(45) Date of Patent: Feb. 9, 2016

(54) RRAM ARRAY HAVING LATERAL RRAM CELLS AND VERTICAL CONDUCTING STRUCTURES

(71) Applicant: Taiwan Semiconductor Manufacturing Co., Ltd, Hsin-Chu (TW)

(72) Inventor: Hsing-Chih Lin, Tainan (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 123 days.

(21) Appl. No.: 14/204,388

(22) Filed: Mar. 11, 2014

(65) Prior Publication Data

US 2015/0263073 A1    Sep. 17, 2015

(51) Int. Cl.
*H01L 29/06*  (2006.01)
*H01L 27/24*  (2006.01)
*H01L 45/00*  (2006.01)

(52) U.S. Cl.
CPC ........ *H01L 27/2481* (2013.01); *H01L 45/1226* (2013.01); *H01L 45/1253* (2013.01); *H01L 45/14* (2013.01); *H01L 45/142* (2013.01); *H01L 45/143* (2013.01); *H01L 45/144* (2013.01); *H01L 45/146* (2013.01); *H01L 45/147* (2013.01); *H01L 45/1608* (2013.01); *H01L 45/1675* (2013.01)

(58) Field of Classification Search
CPC ............ H01L 27/2481; H01L 45/1226; H01L 45/1253; H01L 45/14; H01L 45/144; H01L 45/146; H01L 45/147; H01L 45/1608; H01L 45/1675
USPC ....................................... 257/5, 43
See application file for complete search history.

(56) References Cited

U.S. PATENT DOCUMENTS 8,148,708 B2 *  4/2012  Hwang .................. H01L 27/24
                                                257/3
2013/0234094 A1   9/2013  Chang et al.

* cited by examiner

*Primary Examiner* — Tu-Tu Ho
(74) *Attorney, Agent, or Firm* — Birch, Stewart, Kolasch & Birch, LLP

(57) ABSTRACT

An RRAM array is provided. The RRAM array includes a plurality of horizontal electrode lines elongated in a horizontal direction. The RRAM array also includes a plurality of conducting structures elongated in a vertical direction. Each of the conducting structures includes a plurality of electrode blocks and a plurality of contact vias which are alternately arranged. The electrode blocks and the electrode lines are on the same horizontal planes. The RRAM array further includes a plurality of resistance variable elements sandwiched between the electrode lines and the electrode blocks.

20 Claims, 9 Drawing Sheets

RRAM ARRAY HAVING LATERAL RRAM CELLS AND VERTICAL CONDUCTING STRUCTURES

BACKGROUND

There is a frequent demand for smaller devices with more memory. Some efforts have been initiated in using a resistance variable as a mechanism for creating more memory in less space. Resistive random access memory (RRAM) is a memory structure including an array of RRAM cells, each of which can change and maintain the value of its resistivity based on applied electrical conditions. Particularly, each of the RRAM cells includes a resistance variable layer, the resistance of which can be adjusted to represent logic "0" or logic "1".

From an application point of view, RRAM has many advantages. RRAM has a simple cell structure and CMOS logic compatible processes which result in a reduction of manufacturing complexity and cost in comparison with non-volatile memory structures. In addition, RRAM can be used in lower power conditions and has a faster timescale than other non-volatile memory structures. In order to replace the current NAND flash memories, which have a high stack density in a 3D array, RRAM array has been eagerly developing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
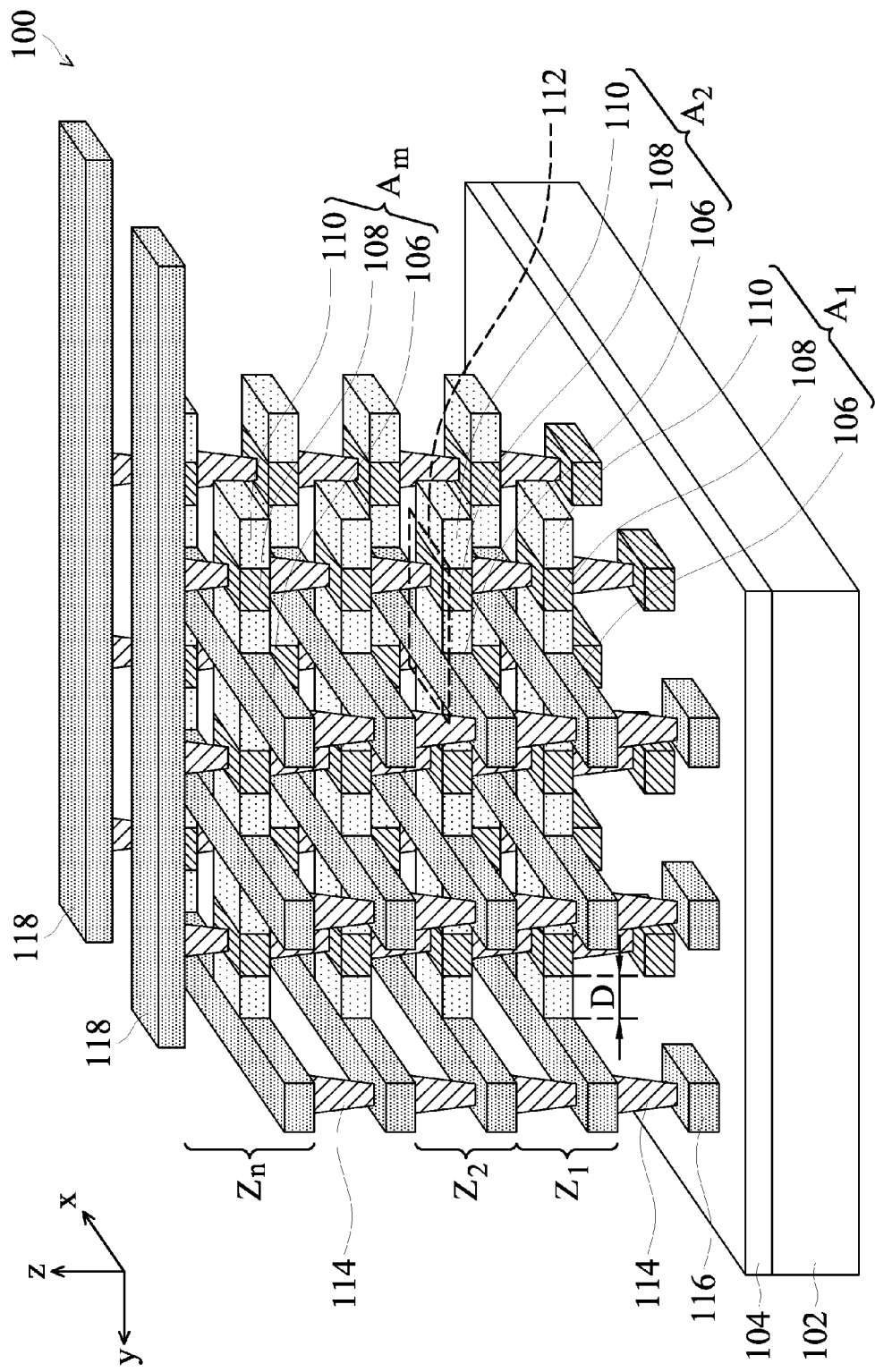
FIG. 1 illustrates a perspective schematic of a resistive random access memory (RRAM) array 100 in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a perspective schematic of a resistive random access memory (RRAM) array 100 in accordance with some embodiments. In some embodiments, the RRAM array 100 is a three-dimensional pattern defined by rectangular coordinates having x, y and z directions, each of the x, y and z directions being orthogonal with the other two. Some features not shown in FIG. 1 for clarity are insulation layers and the non-active areas of a resistance variable material.

The RRAM array 100 is formed over a substrate 102. The RRAM array 100 includes a plurality of vertical stacking sets $Z_1$ to $Z_n$ (n is any positive integer greater than 1) stacked in the z-direction. The substrate 102 may be a substrate employed in a semiconductor process, such as a silicon substrate. The substrate 102 may include a complementary metal oxide semiconductor (CMOS) circuit, an isolation structure, a diode, or a capacitor. In some embodiments, the substrate 102 has an oxide layer 104 on its top surface. In some embodiments, each "vertical stacking set" of the three-dimensional RRAM array 100 is formed of at least two layers, including a first layer structure $A_m$ (m is any positive integer corresponding to the "n") and a second layer structure. The vertical stacking sets $Z_1$ to $Z_n$ are positioned at different distances in the z-direction above the substrate 102 and are stacked on top of each other.

In some embodiments, the first layer structures $A_1$ to $A_m$ are active layer structures which include a plurality of RRAM cells arranged in the active layer structures. Each of the first layer structures $A_1$ to $A_m$ may be in a horizontal plane (e.g., the x-y plane) and parallel to each other and a surface of the substrate 102. Each of the first layer structures $A_1$ to $A_m$ includes a plurality of electrode lines 106 and a plurality of electrode blocks 108. The electrode lines 106 may be elongated in a first direction, such as the x-direction or other suitable directions in the x-y plane although the only elongation in the x-direction is shown in FIG. 1. In each first layer structure $A_1$ to $A_m$, the electrode lines 106 are periodically arranged in the y-direction with a constant gap between adjacent electrode lines 106. In some embodiments, the electrode lines 106 include a main metal layer formed of gold (Au), platinum (Pt), ruthenium (Ru), iridium (Ir), aluminum (Al), copper (Cu), tungsten (W), their alloys such as aluminum-copper alloy (Al—Cu) or iridium-tantalum alloy (Ir—Ta), or a combination thereof. In some embodiments, the electrode lines 106 further include a barrier layer formed of Ti, TiN, Ta, or TaN. The barrier layer is capable of being used as an anti-oxidation layer to protect the main metal layer from being oxidized. In addition, the barrier layer is also capable of being used as an adhesion layer to improve the adhesion between the main metal layer and other materials.

In some embodiments, the electrode blocks 108 are formed between the two adjacent electrode lines 106 in the y-direction and periodically elongated in the x-direction with a substantially constant gap between adjacent electrode blocks 108. In some embodiments, each of the electrode blocks 108 has a substantially constant distance D to the adjacent electrode lines 106. The electrode blocks 108 may be in the shape of a cube, cuboid, an island, an ellipsoid. In some embodiments, the electrode blocks 108 are formed of Au, Pt, Ru, Ir, Al, Cu, W, their alloys such as Al—Cu alloy or Ir—Ta alloy, or a combination thereof. In some embodiments, the distance D is in a range from about 5 nm to about 300 nm. In some embodiments, the widths of electrode blocks 108 and the electrode lines 106 in the y-direction are substantially equal to the substantially constant distance D.

Each of the first layer structures $A_1$ to $A_m$ further includes the resistance variable material (only active areas shown in FIG. 1) filled in the spaces remaining between the electrode blocks 108 and the electrode lines 106. Portions of the resistance variable material sandwiched between the electrode blocks 108 and electrode lines 106 in the x-direction are the active areas of the resistance variable material. In FIG. 1 and in the following description, the active areas of the resistance variable material are referred to as resistance variable elements 110. Cells 112 of the RRAM array may be built up by the resistance variable elements 110, the electrode blocks 108 and the electrode lines 106. For example, each cell 112 of the RRAM array includes one of the resistance variable elements 110 sandwiched between and in direct contact with its adjacent electrode block 108 and its adjacent electrode line 106. Accordingly, as shown in FIG. 1, the RRAM cells 112 are lateral RRAM cells, in which the components of the RRAM cells are stacked in the horizontal plane. Each of the RRAM cells 112 may switch from one state to another state by applying a predetermined voltage or current to the RRAM cells 112. For example, the RRAM cell 112 has a state of relatively high resistance, referred to as "high resistance state", and a state of relatively low resistance, referred to as "low resistance state". The RRAM cells 112 may be switched from the high resistance state to the low resistance state, or from the low resistance state to the high resistance state by applying a predetermined voltage or current.

Since the resistance variable elements 110, the electrode blocks 108 and the electrode lines 106 are formed in the same layer structures, their patterns can be formed by a lithography technique. In some embodiments, the lithography technique provides better dimension control than deposition techniques. Accordingly, the film thickness of the resistance variable elements 110 (in the y-direction) of each RRAM cell 112 can be precisely controlled.

In some embodiments, the resistance variable material includes a high-k dielectric material, a binary metal oxide, a transitional metal oxide, chalcogenides, carbon polymers and/or perovskites. For example, the resistance variable material includes titanium oxide, nickel oxide, hafnium oxide, zirconium oxide, tungsten oxide, zinc oxide, aluminum oxide, tantalum oxide, molybdenum oxide or copper oxide. Alternatively the resistance variable material includes $Ge_2Sb_2Te_5$, AgInSbTe, $SrTiO_3$, $ZrTiO_3$, $Pr_{0.7}Ca_{0.3}MnO_3$ (PCMO), GeS, GeSe, $Cu_2S$, copper 7,7,8,8-tetracyanoquinodimethane (CuTCNQ) or a combination thereof.

In some embodiments, the insulation layer (not shown) of each vertical stacking set $Z_n$ is located on the active layer $A_m$. The insulation layer may include silicon oxide, silicon nitride, silicon oxynitride, low-k dielectric materials or a combination thereof. Examples of low-k dielectric materials include, but are not limited to, fluorinated silica glass (FSG), carbon doped silicon oxide, amorphous fluorinated carbon, parylene, bis-benzocyclobutenes (BCB), or polyimide.

In some embodiments, a plurality of contact vias 114 is formed within the insulation layers and electrically connects the adjacent electrode blocks 108 in the z-direction. In some embodiments, the contact vias 114 are formed of tungsten, tungsten-based alloy, copper, copper-based alloy, molybdenum or a combination thereof. Conducting structures formed of the electrode blocks 108 and the contact vias 114 may act as electrode lines like as the electrode lines 106 and construct vertical signal transmitting paths. In some embodiments, the conducting structures of the contact vias 114 and the electrode blocks 108 act as vertical bit lines while the electrode lines 106 act as horizontal word lines. Alternatively, the conducting structures of the contact vias 114 and the electrode blocks 108 act as vertical word lines while the electrode lines 106 act as horizontal bit lines In some embodiments, a bottom electrode layer 116 and a top electrode layer 118 are formed underlying the vertical stacking sets $Z_1$ to $Z_n$ and overlying the vertical stacking sets $A_1$ to $A_m$, respectively. The patterns of the bottom electrode layer 116 and the top electrode layer 118 as shown in FIG. 1 are only for illustration, and they can be arbitrarily varied according to design requirements. In some embodiments, the bottom electrode layer 116 and the top electrode layer 118 may respectively have the same pattern as the electrode blocks 108 and the electrode lines 104, or vice versa. In some embodiments, the bottom electrode layer 116 and the top electrode layer 118 are omitted while the electrode lines 106 and the conducting structures are directly electrically connected to circuits in the substrate 102 or outer electronic devices.

Figure 2:
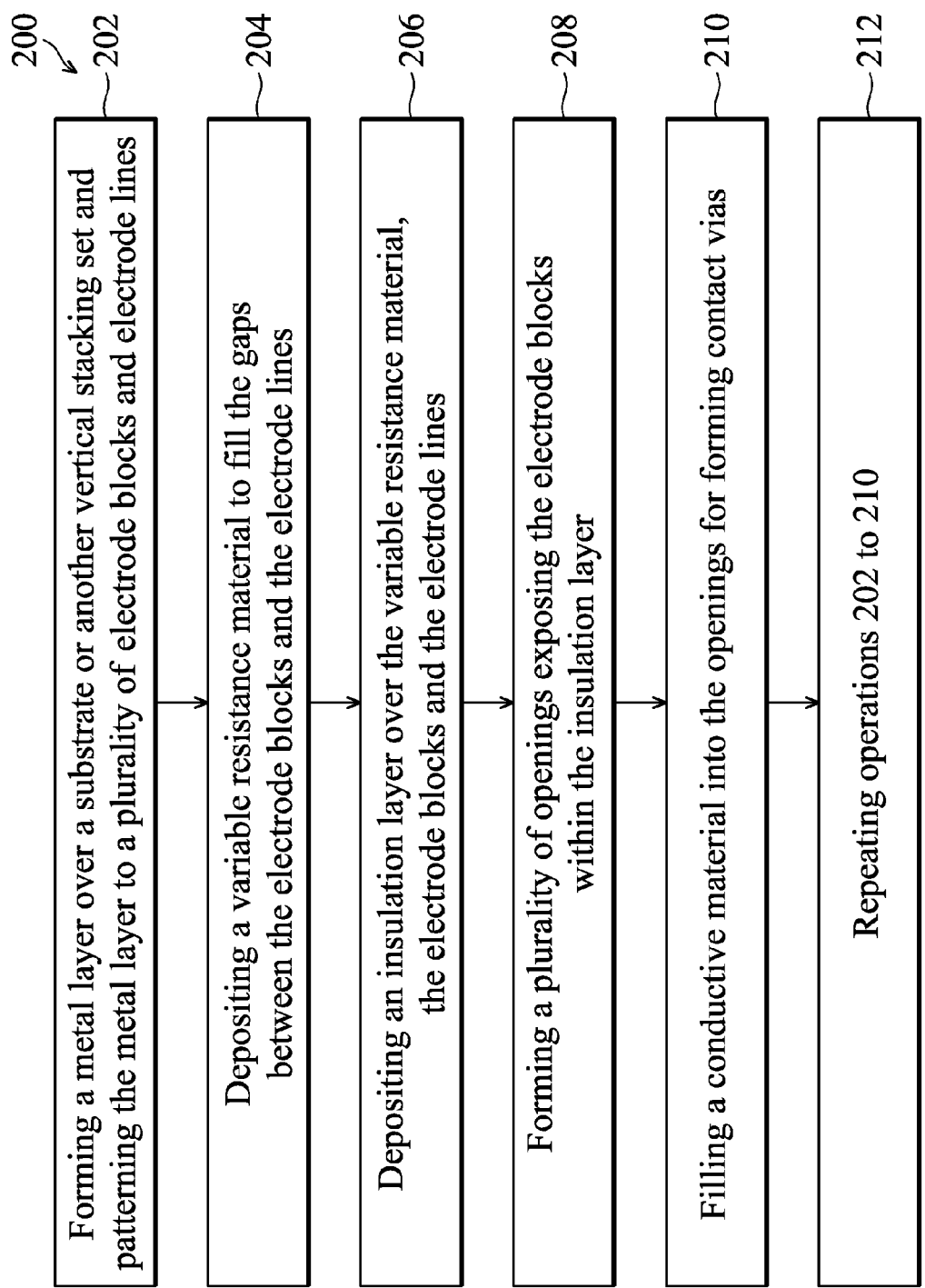
FIG. 2 illustrates a method 200 of fabricating an RRAM array in a flow chart manner in accordance with some embodiments.

FIG. 2 illustrates a method 200 of fabricating an RRAM array in a flow chart manner in accordance with some embodiments. FIGS. 3A to 3E illustrate top views of an RRAM array at various intermediate stages of fabrication in accordance with some embodiments. The method 200 starts at operation 202, in which a metal layer is formed over a substrate or another vertical stacking set and patterned to form a plurality of electrode blocks and electrode lines. For example, referring to FIG. 3A, a metal layer is deposited over the insulation layer 104 and patterned to the electrode blocks 108 and the electrode lines 106. The electrode blocks 108 and the electrode lines 106 are alternately arranged in the y-direction and separated from each other. The electrode lines 106 are continuously elongated in the x-direction. The electrode blocks 108 are periodically elongated in the x-direction with a constant gap therebetween. The metal layer may be deposited by chemical vapor deposition (CVD), physical vapor deposition (PVD), atomic layer deposition (ALD), sputtering or other suitable deposition methods. The metal layer may be patterned by any suitable lithography technique. In some embodiments, the lithography technique includes processing, such as photoresist coating, soft baking, mask aligning, exposing pattern, post-exposure baking, developing photoresist, hard baking and stripping after the etching, and etching, such a dry etch or a wet etch.

Figure 3C:
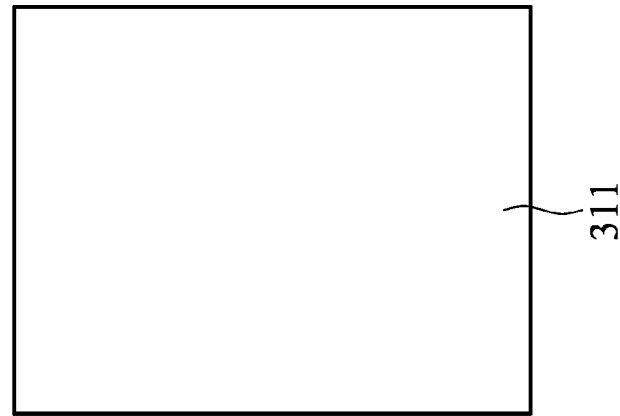
FIGS. 3A to 3E illustrate top views of an RRAM array at various intermediate stages of fabrication in accordance with some embodiments.
Figure 3B:
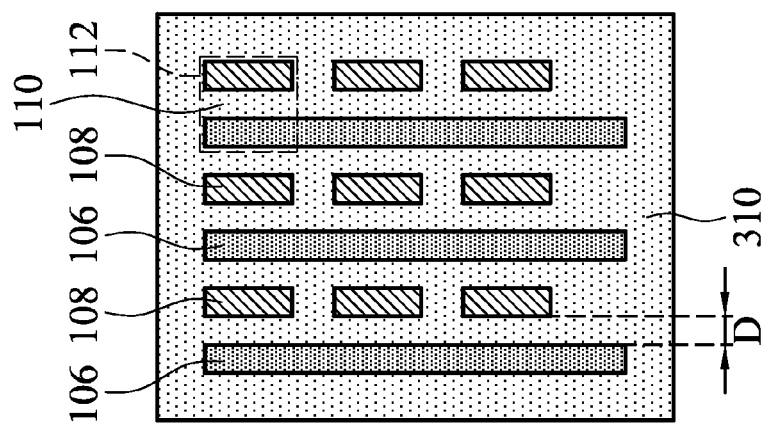

The method 200 continues to operation 204, in which a resistance variable material is deposited to fill the gaps between the electrode blocks and the electrode lines. Referring to FIG. 3B, a resistance variable material 310 is deposited to fill the gaps between the electrode blocks 108 and the electrode lines 106. The resistance variable material 310 may be formed by pulse laser deposition (PLD), ALD or CVD. In some embodiments, a planarization process, such as chemical mechanical polishing, is performed on the resistance variable material 310 to remove excess resistance variable material 310 above the electrode blocks 108 and electrode lines 106. As such, the resistance variable material 310, the electrode blocks 108 and the electrode lines 106 have substantially coplanar top surfaces. The first layer structure, including a plurality of lateral RRAM cells 112, of a vertical stacking set is thus formed. The film thickness of the resistance variable element 110 is determined by the distance D from the electrode blocks 108 to the adjacent electrode lines 106 in the y-direction.

The method 200 continues to operation 206, in which an insulation layer is deposited over the resistance variable material, the electrode blocks and the electrode lines. Referring to FIG. 3C, an insulation layer 311 is deposited and covers the resistance variable material 310, the electrode blocks 108 and the electrode lines 106. The insulation layer may include silicon oxide, silicon nitride, silicon oxynitride, low-k dielectric materials or a combination thereof. The insulation layer 311 is formed by CVD, ALD, or spinning on glass (SOG). In some embodiments, the insulation layer 311 has a thickness ranging from about 500 A to about 8000 A.

Figure 3A:
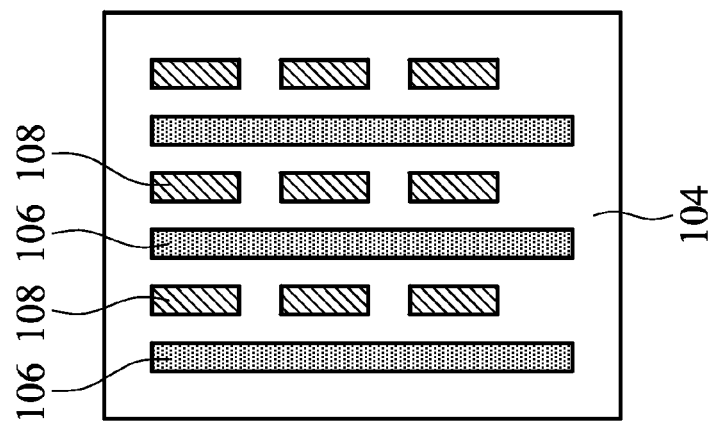
Figure 3E:
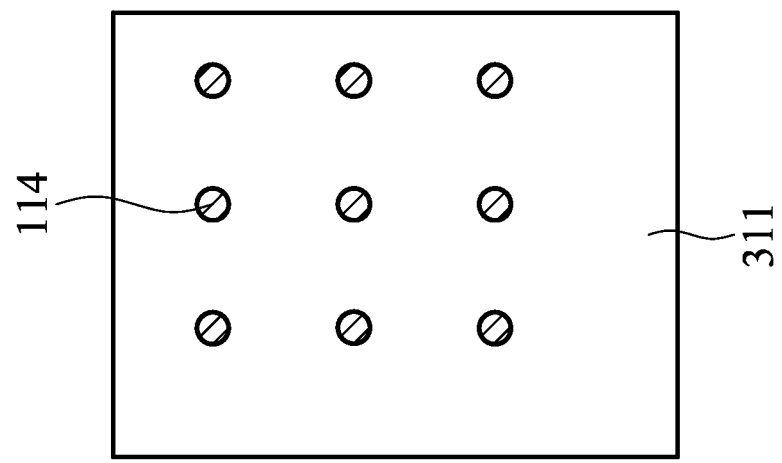
Figure 3D:
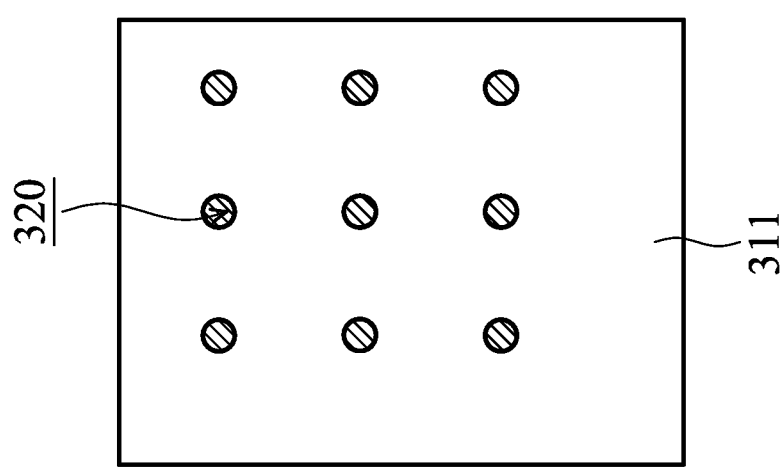

The method 200 continues to operation 208, in which a plurality of openings is formed within the insulation layer and exposes the electrode blocks. Referring to FIG. 3D, a plurality of openings 320 is formed within the insulation layer 311 and exposes a portion of the electrode blocks 108. In some embodiments, the openings 320 are formed by plasma etch, a chemical wet etch, a laser drill, and/or other suitable etching processes.

The method 200 continues to operation 210, in which a conductive material is filled into openings for forming contact vias. Referring to FIG. 3E, a conductive material is filled into the openings 320 and forms the contact vias 114. The contact vias 114 are formed within the insulation layer 311 and in direct contact with the electrode blocks 108. A second layer structure is formed on the first layer structure, and the first vertical stacking set $Z_1$ is thus formed. In some embodiments, a chemical mechanical polishing (CMP) process is performed to remove the excess conductive material over the openings 320.

In some embodiments, the method continues to operation 212, in which the operations 202 to 210 are repeated to form more sets of the vertical stacking sets over the first stacking sets $Z_1$. Each of the electrode blocks 108 of the next vertical stacking sets $Z_2$ to $Z_n$ is aligned to and in direct contact with the contact vias 114 of the first vertical stacking set $Z_1$. In some embodiments, the top electrode layer 118 as shown in FIG. 1 is formed over the last set $Z_n$ of the vertical stacking sets.

Figure 4:
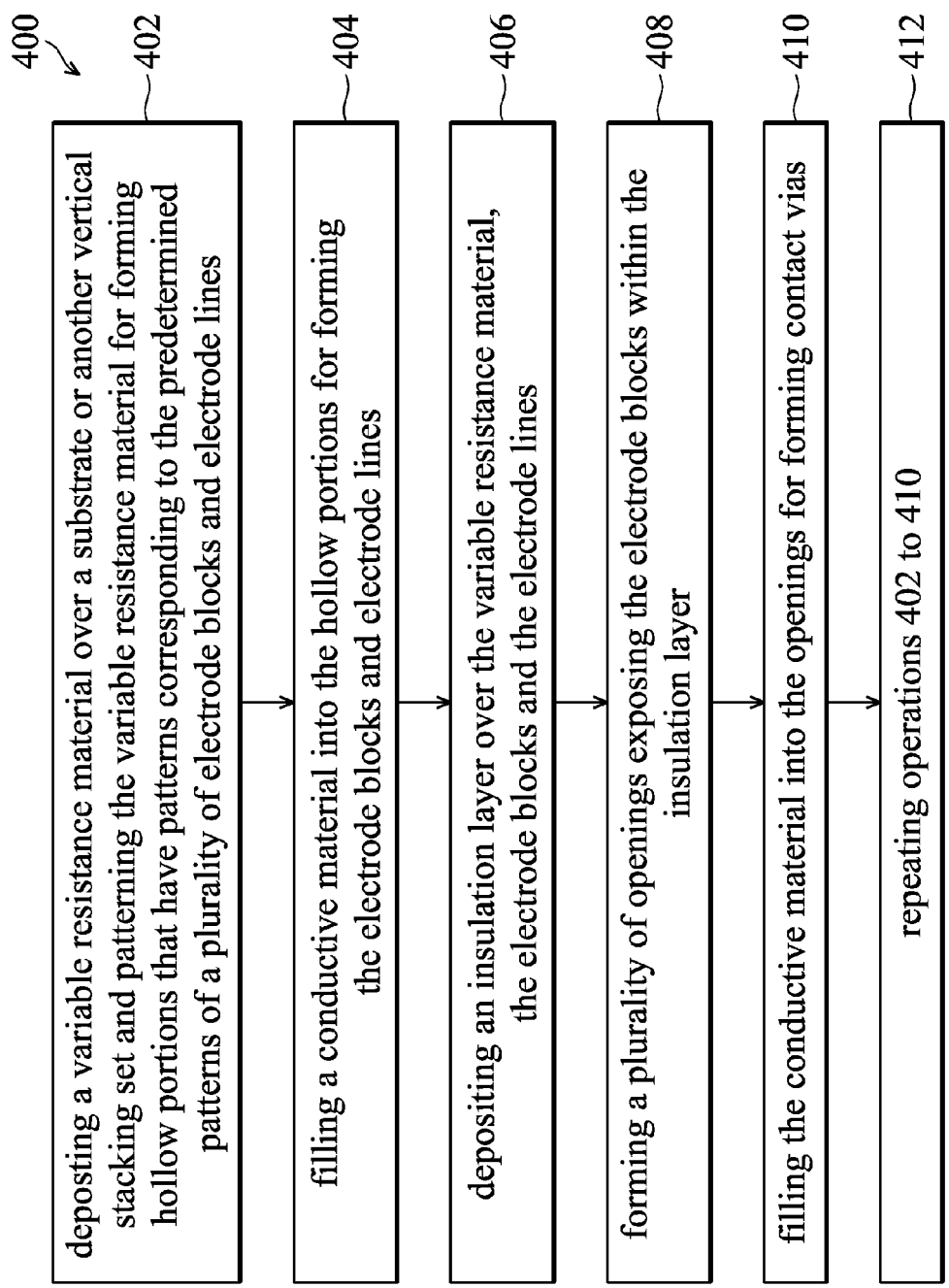
FIG. 4 illustrates a method 400 of fabricating an RRAM array in a flow chart manner in accordance with some embodiments.
Figure 5B:
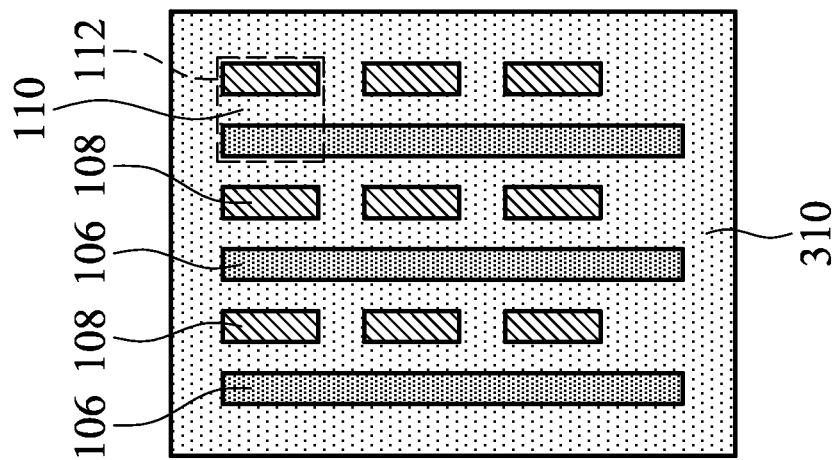
FIGS. 5A to 5B illustrate top views of an RRAM array at various intermediate stages of fabrication in accordance with some embodiments.
Figure 5A:
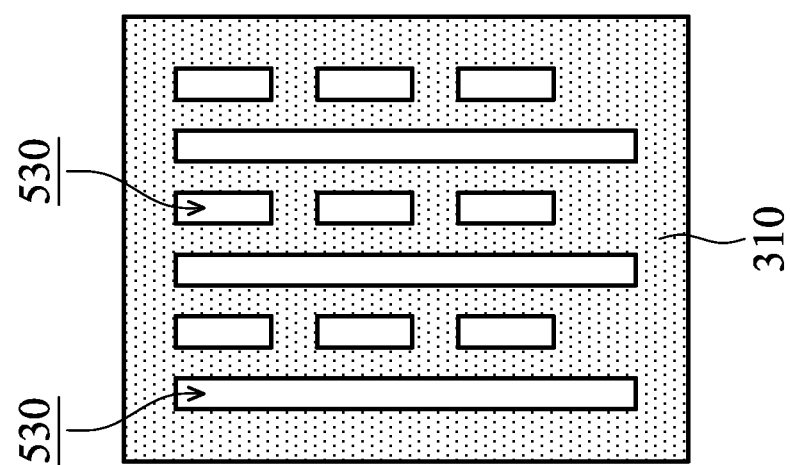

FIG. 4 illustrates a method 400 of fabricating an RRAM array in a flow chart manner in accordance with some embodiments. FIGS. 5A to 5B illustrate top views of an RRAM array at various intermediate stages of fabrication in accordance with some embodiments.

The method 400 starts at operation 402, in which a resistance variable material is deposited over a substrate or another vertical stacking set and patterned to have hollow portions that have patterns corresponding to the predetermined patterns of a plurality of electrode blocks and electrode lines. For example, referring to FIG. 5A, a resistance variable material 310 is deposited over the substrate 102 or another vertical stacking set. In some embodiments, hollow portions 530 are formed within the resistance variable material 310. The hollow portions 530 may have patterns corresponding to the predetermined patterns of the electrode blocks 108 and the electrode lines 106 as shown in FIG. 3A. The resistance variable material 310 may be patterned by any suitable lithography technique. In some embodiments, the lithography technique includes processing, such as photoresist coating, soft baking, mask aligning, exposing pattern, post-exposure baking, developing photoresist, hard baking and stripping after the etching, and etching, such a dry etch or a wet etch.

Afterwards, the method 400 continues to operation 404, in which a conductive material is filled into the hollow portions for forming the electrode blocks and electrode lines. Referring to FIG. 5B, a conductive material is filled into the hollow portions 530 of the resistance variable material 310 and forms a structure substantially the same as that shown in FIG. 3B. In some embodiments, the conductive material includes gold (Au), platinum (Pt), ruthenium (Ru), iridium (Ir), aluminum (Al), copper (Cu), tungsten (W), their alloys such as aluminum-copper alloy (Al—Cu) or iridium-tantalum alloy (Ir—Ta), or a combination thereof. In some embodiments, a chemical mechanical polishing (CMP) process is performed to remove the excess conductive material over the hollow patterns 530. At this stage, a first layer structure, including a plurality of lateral RRAM cells 112, of a vertical stacking set is formed.

The method 400 continues to operation 406, in which an insulation layer is deposited over the resistance variable material, the electrode blocks and the electrode lines. The method 400 continues to operation 408, in which a plurality of openings exposing the electrode blocks is formed within the insulation layer. The method 400 continues to operation 410, the conductive material is filled into the openings for forming contact vias. The operations 406 to 410 are basically the same as the operations 206 to 210 as illustrated in FIG. 2, and their details are not repeated herein. A vertical staking set containing the first layer structure and a second layer structure is formed. In some embodiments, the method 400 continues to 412, in which the operations 402 to 410 are repeated for forming more vertical stacking sets over the vertical stacking set.

Figure 6:
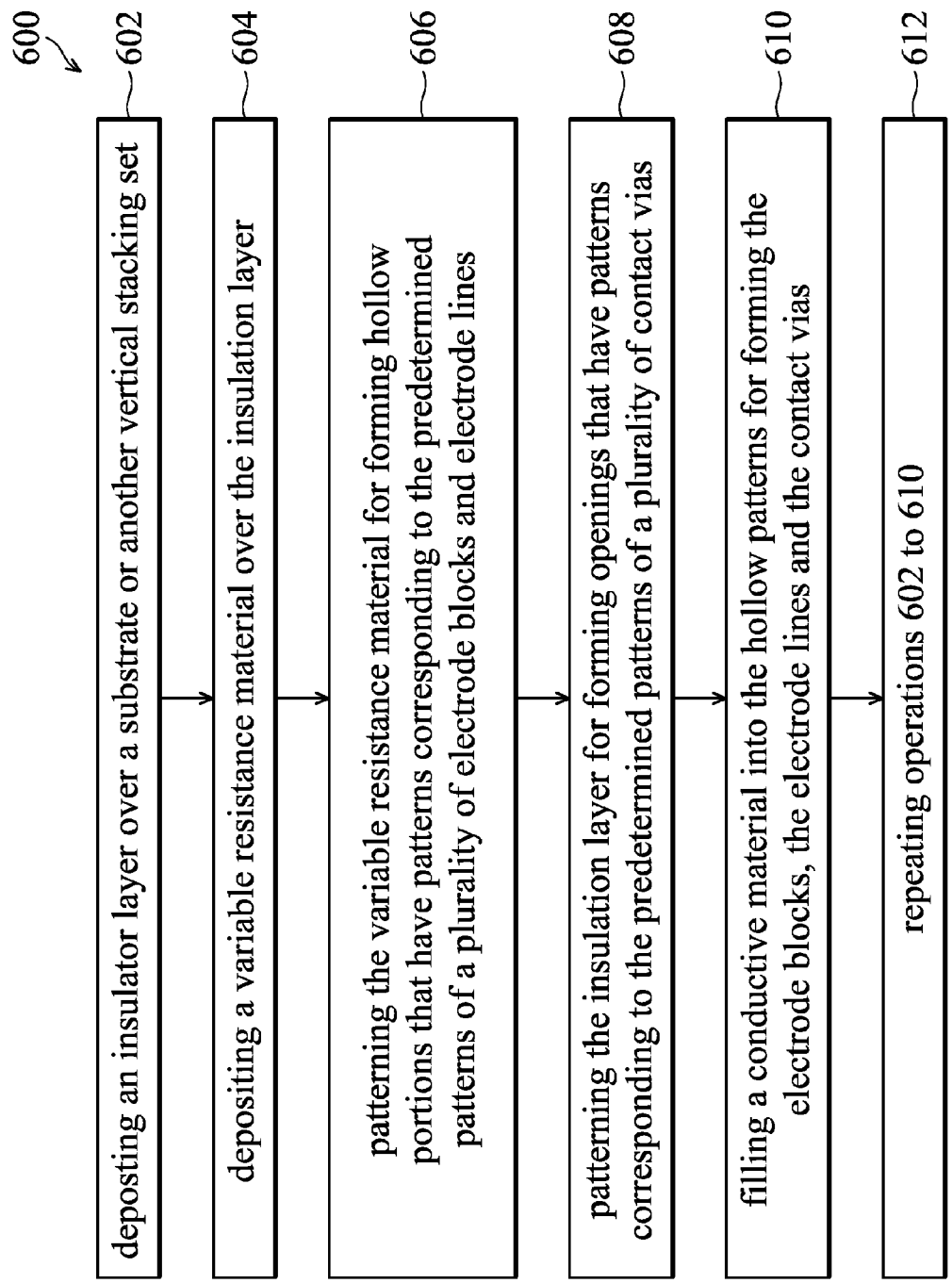
FIG. 6 illustrates a method 600 of fabricating an RRAM array in a flow chart manner in accordance with some embodiments.

FIG. 6 illustrates a method 600 of fabricating an RRAM array in a flow chart manner in accordance with some embodiments. FIGS. 7A to 7D illustrate top views of an RRAM array at various intermediate stages of fabrication in accordance with some embodiments.

The method 600 starts at operation 602, in which an insulation layer is deposited over a substrate or another vertical stacking set. For example, referring to FIG. 7A, the insulation layer 311 is deposited over the substrate 102 or another vertical stacking set. The method 600 continues to operation 604, in which a resistance variable material is deposited over the insulation layer. For example, referring to FIG. 7B, the resistance variable material 310 is deposited over the insulation layer 311.

The method 600 continues to operation 606, the resistance variable material is patterned for forming hollow portions that have patterns corresponding to the predetermined patterns of a plurality of electrode blocks and electrode lines. For example, referring to FIG. 7C, the resistance variable material 310 is patterned to have hollow portions 730. In some embodiments, the hollow portions 730 have patterns corresponding to the predetermined patterns of electrode blocks and electrode lines, such as the electrode blocks 108 and the electrode lines as shown in FIG. 3E as shown in FIG. 3A. In some embodiments, the hollow portions 730 of the resistance variable material 310 expose the top of the insulation layer 311.

The method continues to operation 708, in which the insulation layer is patterned for forming openings that have patterns corresponding to the patterns of contact vias. For example, referring to FIG. 7D, the insulation layer 311 is patterned through the hollow portion 730, for forming openings 731 in the insulation layer 311. The insulation layer 311 may be patterned by any suitable lithography technique. In some embodiments, the openings 731 have patterns corresponding to the predetermined patterns of contact vias, such as the contact vias 114 as shown in FIG. 3E. In some embodiments, the openings 731 expose the underlying substrate or another vertical stacking set.

Figure 7C:
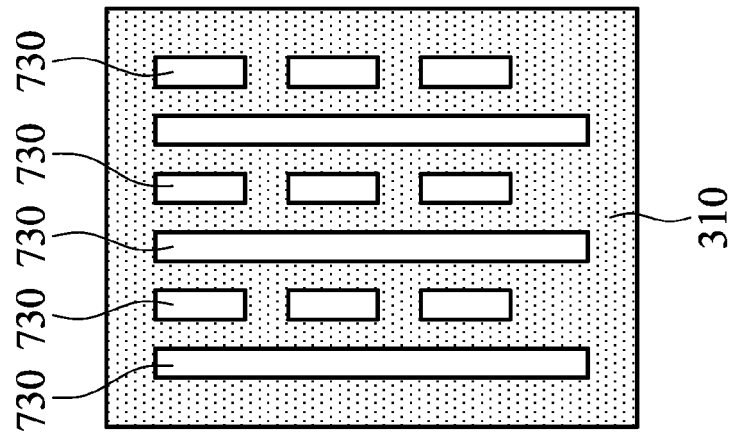
FIGS. 7A to 7E illustrate top views of an RRAM array at various intermediate stages of fabrication in accordance with some embodiments.
Figure 7B:
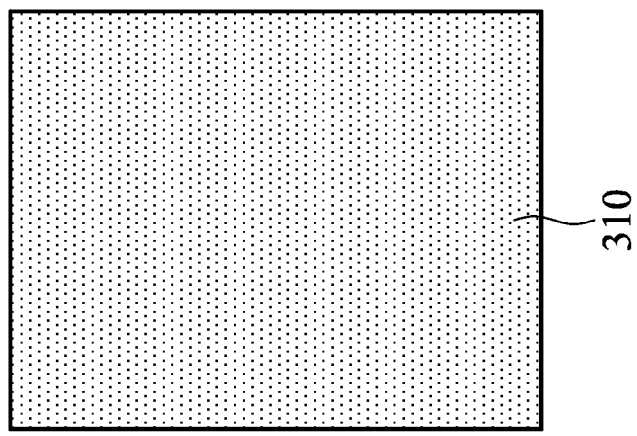
Figure 7A:
Figure 7E:
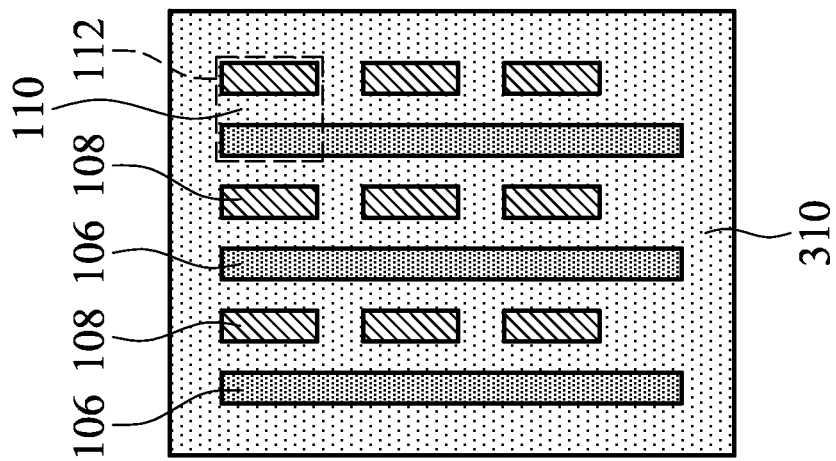
Figure 7D:
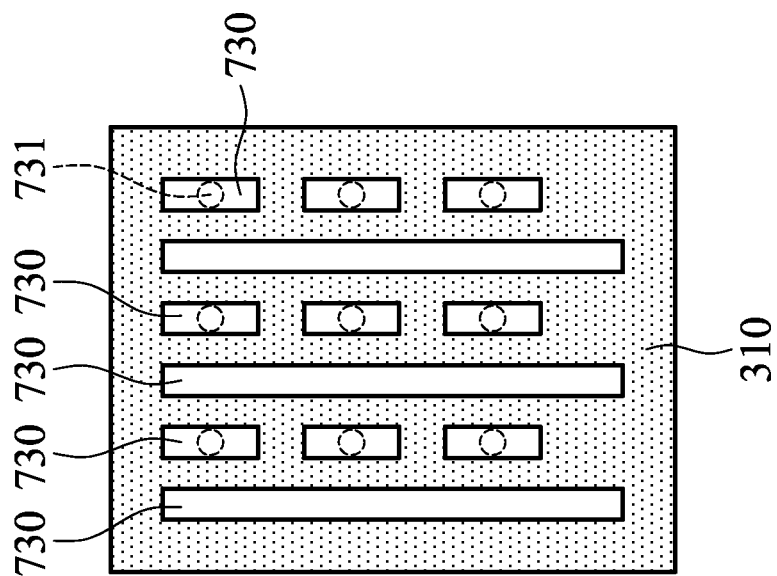

Afterwards, the method continues to operation 710, in which a conductive material is filled into the openings and the hollow portions for forming the contact vias and the electrode block and lines. For example, referring to FIG. 7E, a conductive material is filled into the openings 730 of the insulation layer 310 and the hollow portions 730 and forms the contact vias 114 and the electrode blocks 108 and lines 106. In some embodiments, a chemical mechanical polishing (CMP) process is performed to remove the excess conductive material over the hollow portions 730. At this stage, a vertical stacking set is formed. In some embodiments, the method 700 continues to the operation 712, in which operations 702 to 710 are repeated for forming more vertical stacking sets over the vertical stacking set.

According to some embodiments, an RRAM array in a three dimensional pattern is provided. The RRAM array includes a plurality of lateral RRAM cells and vertical conducting structures. The film thickness of a resistance variable element of the RRAM cells can be better controlled by a lithography technique. In addition, the resistance switch of the RRAM cells can be controlled from vertical signal transmitting paths, such as the vertical conducting structures.

In accordance with some embodiments, an RRAM array is provided. The RRAM array includes a plurality of horizontal electrode lines elongated in a horizontal direction. The RRAM array also includes a plurality of conducting structures elongated in a vertical direction. Each of the conducting structures includes a plurality of electrode blocks and a plurality of contact vias which are alternately arranged. The electrode blocks and the electrode lines are on the same horizontal planes. The RRAM array further includes a plurality of resistance variable elements sandwiched between the electrode lines and the electrode blocks.

In accordance with some embodiments, an RRAM array defined by rectangular coordinates having x, y and z directions is provided. The An RRAM array includes a plurality of vertical stacking sets stacked to each other in the z-direction. Each of the vertical stacking sets includes a first layer structure and a second layer structure thereon. The first layer structure includes a plurality of electrode lines and a plurality of electrode blocks alternately arranged and separated from each other in an x-y plane. The first layer structure also includes a resistance variable material filling into gaps between the electrode lines and the electrode blocks. The second layer structure includes an insulation layer on the first layer structure and a plurality of contact vias within the insulation layer and aligned to the electrode blocks.

In accordance with some embodiments, a method for fabricating an RRAM array is provided. The method includes forming a first layer structure. The first layer structure includes a plurality of electrode lines and a plurality of electrode blocks separated from each other and a resistance variable material filling into the gaps between the electrode blocks and the electrode lines. The method includes forming a second layer structure on the first layer structure. The second layer structure includes an insulation layer and a plurality of contact vias within the insulation layer and aligned to the electrode blocks. The method further includes repeating the above steps to form resultant layer structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An RRAM array, comprising:
   a plurality of horizontal electrode lines elongated in a horizontal direction;
   a plurality of conducting structures elongated in a vertical direction, wherein each of the conducting structures comprises a plurality of electrode blocks and a plurality of contact vias which are alternately arranged, and wherein the electrode blocks and the electrode lines are on a same horizontal plane; and
   a plurality of resistance variable elements sandwiched between the electrode lines and the electrode blocks.

2. The RRAM array as claimed in claim 1, wherein the electrode blocks are periodically elongated with a substantially constant gap therebetween in the horizontal direction.

3. The RRAM array as claimed in claim 1, wherein each of the electrode blocks is in a shape of a cube, cuboid, an island, an ellipsoid, or a combination thereof.

4. The RRAM array as claimed in claim 1, wherein top surfaces of the electrode blocks, the electrode lines and the resistance variable elements are substantially coplanar.

5. The RRAM array as claimed in claim 1, wherein the electrode lines are bit lines, and the conducting structures are word lines.

6. The RRAM array as claimed in claim 1, wherein the electrode lines are word lines, and the conducting structures are bit lines.

7. An RRAM array, defined by rectangular coordinates having x, y and z directions, wherein the RRAM array comprises:
   a plurality of vertical stacking sets stacked to each other in the z-direction, wherein each of the vertical stacking sets comprises a first layer structure and a second layer structure thereon, wherein the first layer structure comprises:
      a plurality of electrode lines and a plurality of the electrode blocks alternately arranged and separated from each other in an x-y plane;
      a resistance variable material filling into gaps between the electrode lines and the electrode blocks;
   wherein the second layer structure comprises:
      an insulation layer on the first layer structure; and
      a plurality of contact vias within the insulation layer and aligned to the electrode blocks.

8. The RRAM array as claimed in claim 7, wherein the electrode blocks and the contact vias of the vertical stacking sets form a plurality of conducting structures which is elongated in the z-direction.

9. The RRAM array as claimed in claim 7, wherein the electrode lines are continuously elongated in the x-direction, and the electrode blocks are periodically arranged with a substantially constant gap therebetween in the x-direction.

10. The RRAM array as claimed in claim 9, wherein the electrode lines and the electrode blocks are alternately arranged with a substantially constant distance from the electrode blocks to adjacent electrode lines in the y-direction.

11. The RRAM array as claimed in claim 10, wherein the substantially constant distance is in a range from about 5 nm to about 300 nm.

12. The RRAM array as claimed in claim 10, wherein the widths of electrode blocks and the electrode lines in the y-direction are substantially equal to the substantially constant distance.

13. The RRAM array as claimed in claim 7, wherein portions of the resistance variable material between the electrode blocks and the electrode lines in the y-direction construct a plurality of lateral RRAM cells of the RRAM array with the electrode blocks and the electrode lines.

14. The RRAM array as claimed in claim 7, wherein the resistance variable material comprises titanium oxide, nickel oxide, hafnium oxide, zirconium oxide, tungsten oxide, zinc oxide, aluminum oxide, tantalum oxide, molybdenum oxide, $Ge_2Sb_2Te_5$, AgInSbTe, $SrTiO_3$, $ZrTiO_3$, $Pr_{0.7}Ca_{0.3}MnO_3$, GeS, GeSe, $Cu_2S$, copper 7,7,8,8-tetracyanoquinodimethane (CuTCNQ) or a combination thereof.

15. The RRAM array as claimed in claim 7, wherein each of the electrode blocks is in the shape of a cube, cuboid, an island, an ellipsoid, or a combination thereof.

16. The RRAM array as claimed in claim 7, wherein the insulation layer comprises silicon oxide, silicon nitride, silicon oxynitride, low-k dielectric materials or a combination thereof.

17. A method for fabricating an RRAM array, comprising:
(a) forming a first layer structure, wherein the first layer structure comprises a plurality of electrode lines and a plurality of electrode blocks separated from each other and a resistance variable material filling into the gaps between the electrode blocks and the electrode lines;
(b) forming a second layer structure on the first layer structure, wherein the second layer structure comprises an insulation layer and a plurality of contact vias within the insulation layer and aligned to the electrode blocks; and
(c) repeating steps (a) and (b) to form resultant layer structures.

18. The method as claimed in claim 17, wherein the step (a) comprises:
depositing a metal layer over a substrate or another insulation layer;
patterning the metal layer by a lithography technique to form the electrode blocks and the electrode lines;
depositing the resistance variable material over the substrate and the another insulation layer; and
removing a portion of the resistance variable material above the electrode blocks and the electrode lines.

19. The method as claimed in claim 17, wherein the step (a) comprises:
depositing the resistance variable material over the substrate or another insulation layer;
patterning the resistance variable material by a lithography technique such that the resistance variable material has hollow portions that have patterns corresponding to the patterns of electrode blocks and the electrode lines;
depositing a metal layer over the substrate or the another insulation layer to form the electrode blocks and the electrode lines; and
removing a portion of the metal layer above the resistance variable material.

20. The method as claimed in claim 17, wherein the step (b) comprises:
forming the insulation layer on the first layer structure;
forming a plurality of openings exposing the electrode blocks; and
depositing a conductive material into the openings to form the contact vias.

* * * * *